United States Patent
Maguire et al.

(10) Patent No.: US 9,291,694 B2
(45) Date of Patent: Mar. 22, 2016

(54) SYSTEM AND METHOD FOR MONITORING ELECTRICAL POWER USAGE IN AN ELECTRICAL POWER INFRASTRUCTURE OF A BUILDING

(71) Applicant: Belkin International, Inc., Playa Vista, CA (US)

(72) Inventors: Yael G. Maguire, Somerville, MA (US); Karthik Yogeeswaran, Santa Monica, CA (US)

(73) Assignee: Belkin International, Inc., Playa Vista, CA (US)

( * ) Notice: Subject to any disclaimer, the term of this patent is extended or adjusted under 35 U.S.C. 154(b) by 558 days.

(21) Appl. No.: 13/736,778

(22) Filed: Jan. 8, 2013

(65) Prior Publication Data

US 2013/0119972 A1     May 16, 2013

Related U.S. Application Data

(63) Continuation-in-part of application No. 13/175,770, filed on Jul. 1, 2011, now Pat. No. 8,805,628, and a continuation-in-part of application No. 13/175,774, filed on Jul. 1, 2011, now Pat. No. 8,972,211.

(60) Provisional application No. 61/361,296, filed on Jul. 2, 2010, provisional application No. 61/380,174, filed on Sep. 3, 2010.

(51) Int. Cl.
*G01R 35/00* (2006.01)
*G01R 35/04* (2006.01)
(Continued)

(52) U.S. Cl.
CPC .............. *G01R 35/005* (2013.01); *G01R 35/04* (2013.01); *G01R 15/207* (2013.01); *G01R 21/001* (2013.01); *G01R 21/06* (2013.01); *G01R 22/06* (2013.01); *G01R 22/063* (2013.01)

(58) Field of Classification Search
USPC ............................................ 702/62
See application file for complete search history.

(56) References Cited

U.S. PATENT DOCUMENTS

| | | | |
|---|---|---|---|
| 3,714,516 | A | 1/1973 | Howe |
| 4,612,617 | A | 9/1986 | Laplace, Jr. et al. |

(Continued)

FOREIGN PATENT DOCUMENTS

| | | |
|---|---|---|
| CN | 1379860 | 11/2002 |
| CN | 1495432 | 5/2004 |

(Continued)

OTHER PUBLICATIONS

Steven C. Venema in a Kalman Filter Calibration Method for Analog Quadrature Position Encoders, Copyright 1994, 99 pages.*

(Continued)

*Primary Examiner* — Tung S Lau
(74) *Attorney, Agent, or Firm* — Bryan Cave LLP

(57) ABSTRACT

Some embodiments can concern a method of using an electrical sensor device. The method can include: determining a first current measurement of a first current in an electrical power infrastructure and a first phase angle measurement of the first current; determining that a first load is coupled to the electrical power infrastructure; while the first load is coupled to the electrical power infrastructure, determining a second current measurement of a second current in the electrical power infrastructure and a second phase angle measurement of the second current; and using a Kalman filter to determine one or more first calibration coefficients for the electrical sensor device at least in part using the first current measurement, the second current measurement, the first phase angle, and the second phase angle. Other embodiments are disclosed.

7 Claims, 6 Drawing Sheets

(51) Int. Cl.
*G01R 15/20* (2006.01)
*G01R 21/00* (2006.01)
*G01R 21/06* (2006.01)
*G01R 22/06* (2006.01)

(56) References Cited

U.S. PATENT DOCUMENTS

| | | |
|---|---|---|
| 4,706,073 A | 11/1987 | Vila Masot |
| 4,716,409 A | 12/1987 | Hart et al. |
| 4,804,957 A | 2/1989 | Selph et al. |
| 4,858,141 A | 8/1989 | Hart et al. |
| 4,891,587 A | 1/1990 | Squire |
| 5,229,753 A | 7/1993 | Berg et al. |
| 5,233,342 A | 8/1993 | Yashiro et al. |
| 5,268,666 A | 12/1993 | Michel et al. |
| 5,276,629 A | 1/1994 | Reynolds |
| 5,409,037 A | 4/1995 | Wheeler et al. |
| 5,428,342 A | 6/1995 | Enoki et al. |
| 5,441,070 A | 8/1995 | Thompson |
| 5,483,153 A | 1/1996 | Leeb et al. |
| 5,534,663 A | 7/1996 | Rivers et al. |
| 5,590,179 A | 12/1996 | Shincovich et al. |
| 5,600,310 A | 2/1997 | Whipple et al. |
| 5,635,895 A | 6/1997 | Murr |
| 5,650,771 A | 7/1997 | Lee |
| 5,699,276 A | 12/1997 | Roos |
| 5,717,325 A | 2/1998 | Leeb et al. |
| 5,808,846 A | 9/1998 | Holce et al. |
| 5,880,677 A | 3/1999 | Lestician |
| 5,898,387 A | 4/1999 | Davis et al. |
| 6,094,043 A | 7/2000 | Scott et al. |
| 6,147,484 A | 11/2000 | Smith |
| 6,275,168 B1 | 8/2001 | Slater et al. |
| 6,330,516 B1 | 12/2001 | Kammeter |
| 6,420,969 B1 | 7/2002 | Campbell |
| 6,728,646 B2 | 4/2004 | Howell et al. |
| 6,771,078 B1 | 8/2004 | McCauley et al. |
| 6,816,078 B2 | 11/2004 | Onoda et al. |
| 6,839,644 B1 | 1/2005 | Bryant et al. |
| 6,853,291 B1 | 2/2005 | Aisa |
| 6,906,617 B1 | 6/2005 | Van der Meulen |
| 6,949,921 B1 | 9/2005 | Feight et al. |
| 6,993,417 B2 | 1/2006 | Osann, Jr. |
| 7,019,666 B2 | 3/2006 | Tootoonian Mashhad et al. |
| 7,043,380 B2 | 5/2006 | Rodenberg, III et al. |
| 7,049,976 B2 | 5/2006 | Hunt et al. |
| 7,276,915 B1 | 10/2007 | Euler et al. |
| 7,330,796 B2 | 2/2008 | Addink et al. |
| 7,400,986 B2 | 7/2008 | Latham et al. |
| 7,460,930 B1 | 12/2008 | Howell et al. |
| 7,493,221 B2 | 2/2009 | Caggiano et al. |
| 7,498,935 B2 | 3/2009 | Kodama et al. |
| 7,508,318 B2 | 3/2009 | Casella et al. |
| 7,511,229 B2 | 3/2009 | Vlasak et al. |
| 7,541,941 B2 | 6/2009 | Bogolea et al. |
| 7,546,214 B2 | 6/2009 | Rivers, Jr. et al. |
| 7,656,649 B2 | 2/2010 | Loy et al. |
| 7,719,257 B2 | 5/2010 | Robarge et al. |
| 7,755,347 B1 | 7/2010 | Cullen et al. |
| 8,344,724 B2 | 1/2013 | Leeb et al. |
| 2001/0003286 A1 | 6/2001 | Philippbar et al. |
| 2003/0088527 A1 | 5/2003 | Hung et al. |
| 2003/0097348 A1 | 5/2003 | Cao |
| 2003/0216877 A1 | 11/2003 | Culler et al. |
| 2004/0128034 A1 | 7/2004 | Lenker et al. |
| 2004/0140908 A1* | 7/2004 | Gladwin et al. ......... G01D 4/00 340/870.02 |
| 2004/0196024 A1 | 10/2004 | Stauth et al. |
| 2004/0206405 A1 | 10/2004 | Smith et al. |
| 2004/0229578 A1 | 11/2004 | Lightbody et al. |
| 2005/0001486 A1 | 1/2005 | Schripsema et al. |
| 2005/0067049 A1 | 3/2005 | Fima et al. |
| 2006/0077046 A1 | 4/2006 | Endo |
| 2006/0284613 A1 | 12/2006 | Hastings et al. |
| 2007/0064377 A1 | 3/2007 | DeBoer et al. |
| 2007/0085534 A1 | 4/2007 | Seki et al. |
| 2007/0230094 A1 | 10/2007 | Carlson |
| 2008/0082276 A1 | 4/2008 | Rivers et al. |
| 2008/0086394 A1 | 4/2008 | O'Neil et al. |
| 2008/0091345 A1 | 4/2008 | Patel et al. |
| 2008/0106241 A1 | 5/2008 | Deaver et al. |
| 2008/0172192 A1 | 7/2008 | Banhegyesi |
| 2008/0255782 A1 | 10/2008 | Bilac et al. |
| 2009/0045804 A1 | 2/2009 | Durling et al. |
| 2009/0070058 A1* | 3/2009 | Lin ........................ F41G 1/50 702/93 |
| 2009/0072985 A1 | 3/2009 | Patel et al. |
| 2009/0115620 A1 | 5/2009 | Hunter et al. |
| 2009/0240449 A1 | 9/2009 | Gibala et al. |
| 2009/0312968 A1 | 12/2009 | Phillips |
| 2010/0030393 A1 | 2/2010 | Masters et al. |
| 2010/0049456 A1 | 2/2010 | Dempster et al. |
| 2010/0070214 A1 | 3/2010 | Hyde et al. |
| 2010/0070218 A1 | 3/2010 | Hyde et al. |
| 2010/0109842 A1 | 5/2010 | Patel et al. |
| 2010/0188262 A1 | 7/2010 | Reymann et al. |
| 2011/0004421 A1 | 1/2011 | Rosewell et al. |
| 2011/0050218 A1 | 3/2011 | Lohss |
| 2011/0218746 A1* | 9/2011 | Joo ........................ G06F 19/00 702/62 |
| 2012/0001617 A1 | 1/2012 | Reynolds |
| 2012/0215410 A1* | 8/2012 | Mcclure et al. ....... A01B 79/005 701/50 |

FOREIGN PATENT DOCUMENTS

| | | |
|---|---|---|
| CN | 20121017 | 3/2009 |
| CN | 101523226 | 9/2009 |
| CN | 101562074 | 10/2009 |
| DE | 102007032053 | 1/2009 |
| EP | 200312 | 11/1986 |
| EP | 1136829 | 9/2001 |
| FR | 2645968 | 10/1990 |
| FR | 2680875 | 3/1993 |
| GB | 2228337 | 8/1990 |
| GB | 2235304 | 2/1991 |
| JP | 2001190506 | 7/1989 |
| JP | 2004296663 | 10/1992 |
| JP | 2006062512 | 3/1994 |
| JP | 2009130961 | 5/1997 |
| JP | 10-282161 | * 10/1998 |
| JP | 10282161 | 10/1998 |
| JP | 2001103622 | 4/2001 |
| JP | 2005195427 | 7/2005 |
| JP | 2008122083 | 8/2006 |
| JP | 2007107972 | 4/2007 |
| JP | 2010112936 | 5/2010 |
| KR | 20080114143 | 12/2008 |
| RU | 2200364 | 3/2003 |
| RU | 2402023 | 10/2010 |
| WO | 9304377 | 4/1993 |
| WO | 2008150458 | 12/2008 |
| WO | 2009081407 | 7/2009 |
| WO | 2010007369 | 1/2010 |
| WO | 2012003426 | 1/2012 |

OTHER PUBLICATIONS

Fault Tolerant Control and Fault Detection and Isolation, DOI 10.1007/978-0-85729-650-4_2, © Springer-Verlag London Limited 2011, pp. 7-27.*

Arvola et al., "Billing Feedback as a Means to Encourage Household Electricity Conservation: A Field Experiment in Helsinki." Proceedings of the 1993 Summer Study of the European Council for Energy Efficient Economy: 11-21, 2003.

Beckmann et al., "Some Assembly Required: Supporting End-User Sensor Installation in Domestic Ubiquitous Computing Environments." UbiComp 2004: 107-124, 2004.

Brandon et al., "Reducing Household Energy Consumption: A Qualitative and Quantitative Field Study." Journal of Environmental Psychology: 75-85, 1999.

(56) References Cited

OTHER PUBLICATIONS

Bulletin Des Schweizerischen Elektrotechnischen Vereins vol. 68, No. 20, Oct. 1977. Zurich CH pp. 1081-1086, Weiler 'Experimentelle Bestimmung . . . see pae 1081, right-hand col., paragraph 2; figure 1.
Chetty et al., "Getting to Green: Understanding Resource Consumption in the Home." UbiComp 2008: 242-251, 2008.
Clifford et al., "A Retrofit 60 Hz Current Sensor for Non-Intrusive Power Monitoring at the Circuit Breaker." 8 pp., 2010.
Darby, Sarah., "Making it Obvious: Designing Feedback into Energy Consumption." Proceedings of the Second International Conference on Energy Efficiency in Household Appliances and Lighting: 11 pp., 2000.
Darby, Sarah., "The Effectiveness of Feedback on Energy Consumption: A Review for DEFRA on the Literature on Metering, Billing and Direct Displays." Environmental Change Institute: 21 pp., 2006.
Drenker et al., "Nonintrusive monitoring of electronic loads." IEEE pp. 47-51, Oct. 1999.
Elektronik vol. 35.No. 5, Mar. 1986 Munchen DE pp. 112-117 Christiansen et al—Automatischer Reaktanzmessplatz . . . See p. 1, Right-Hand col., Paragraph 2, p. 2, Right-Hand col., Paragraph 1; Figures 2, 11.
Fischer, Corinna., "Feedback on Household Electricity Consumption: A Tool for Saving Energy?" Energy Efficiency: 79-104, 2008.
Fitzpatrick et al., "Technology-Enabled Feedback on Domestic Energy Consumption: Articulating a Set of Design Concerns." PERVASIVEcomputing: 37-44, 2009.
Froehlich et al., "Sensing Opportunities for Personalized Feedback Technology to Reduce Consumption." UW CSE Technical Report: CSE 09-13-01: 7 pp., 2009.
Froehlich, Jon., "Sensing and Feedback of Everyday Activities to Promote Environmentally Sustainable Behaviors." Thesis Proposal, Computer Science and Engineering, University of Washington: 35 pp., 2009.
Hart, George., "Nonintrusive Appliance Load Monitoring." IEEE Log No. 9206191, pp. 1871-1892, 1992.
Hirsch et al., "The ELDer Project: Social, Emotional, and Environmental Factors in the Design of Eldercare Technologies." Conference on Universal Usability 2000: 72-79, 2000.
Horst, Gale., "Whirlpool Corporation: Woodridge Energy Study and Monitoring Pilot." 1-99, 2006.
Iachello et al., "Privacy and Proportionality: Adapting Legal Evaluation Techniques to Inform Design in Ubiquitous Computing." CHI 2005: 91-100, 2005.
Laughman et al., "Power Signature Analysis." IEEE Power and Engineering Magazine: 56-63, 2003.
Murata et al., "Estimation of Power Consumption for Household Electric Appliances." Proceedings of the 9th International Conference on Neural Information Processing: 2209-2303, 2002.
N.a., "End-User-Deployable Whole House Contact-Less Power Consumption Sensing." UbiComp 2009: 4 pp., 2009.
N.a. "Summary: The Impact of Real-Time Feedback on Residential Electricity Consumption: The Hydro One Pilot." 4 pp., 2006.
Parker et al., "Contract Report: Pilot Evaluation of Energy Savings from Residential Energy Demand Feedback Devices." Florida Solar Energy Center, A Research Institute of the University of Central Florida: 32 pp., 2008.
Patel et al., "At the Flick of a Switch: Detecting and Classifying Unique Electrical Events on the Residential Power Line." UbiComp 2007: 271-288, 2007.
Patel et al., "Detecting Human Movement by Differential Air Pressure Sensing in HVAC System Ductwork: An Exploration in Infrastructure Mediated Sensing." Pervasive: 1-18, 2008.
Patel et al., "PowerLine Positioning: A Practical Sub-Room-Level Indoor Location System for Domestic Use." UbiComp 2006: 441-458, 2006.
Patel, Shwetak., "Bringing Sensing to the Masses: An Exploration in Infrastructure-Mediated Sensing." Intel Labs: 133 pp., 2008.
Ramirez-Munoz et al., "Design and experimental verification of a smart sensor to measure the energy and power consumption in a one-phase AC line." Measurement vol. 42: 412-419, Aug. 2008.
Stuntebeck et al., "Wideband PowerLine Positioning for Indoor Localization." UbiComp 2008: 94-103, 2008.
Tapia et al. "The Design of a Portable Kit of Wireless Sensors for Naturalistic Data Collection." Pervasive 2006 K.P. Fishkin et al. (Eds.): 117-134, 2006.
Ueno et al., "Effectiveness of Displaying Energy Consumption Data in Residential Houses—Analysis on how the Residents Respond." ECEEE 2005 Summer Study—What Works and Who Delivers?: 1289-1299, 2005.
International Search Report and Written Opinion from corresponding Int'l Application No. PCT/US2011/042877, dated Dec. 27, 2011, ten (10) pages.
Hart, George W., Nonintrusive Appliance Load Monitoring, Proceedings of the IEEE, vol. 80, No. 12, Dec. 1992, pp. 1870-1891.
Definition of "correlation", thefreedictionary.com, http://www.thefreedictionary.com/p/correlation, last accessed (Oct. 30, 2012).
Kientz et al., "The Georgia Tech Aware Home." CHI 2008: 3675-3680, 2008.
Mountain, Dean., "Price Influences Demand." DeGroote School of Business, McMaster University: 16 pp., 2008.
Wood et al., "Energy-use Information Transfer for Intelligent Homes: Enabling Energy Conservation with Central and Local Displays." Energy and Buildings, vol. 39: 495-503, 2007.
International Search Report and Written Opinion from corresponding Int'l Application No. PCT/US2011/042877, dated Dec. 26, 2011, ten (10) pages.
International Search Report and Written Opinion from corresponding Int'l Application No. PCT/US2011/042877, dated Feb. 28, 2011, ten (10) pages.
International Search Report and Written Opinion from corresponding Int'l Application No. PCT/US2011/042873, dated Dec. 27, 2011, ten (10) pages.
International Search Report and Written Opinion from corresponding Int'l Application No. PCT/2011/042873.

\* cited by examiner

SYSTEM AND METHOD FOR MONITORING ELECTRICAL POWER USAGE IN AN ELECTRICAL POWER INFRASTRUCTURE OF A BUILDING

CROSS-REFERENCE TO RELATED APPLICATIONS

This application claims the benefit of U.S. patent application Ser. No. 13/175,770, filed Jul. 1, 2011, which claims priority from U.S. Provisional Application No. 61/361,296, filed Jul. 2, 2010 and U.S. Provisional Application No. 61/380,174 filed Sep. 3, 2010. This application also claims the benefit of U.S. patent application Ser. No. 13/175,774, filed Jul. 1, 2011, which claims priority from U.S. Provisional Application No. 61/361,296, filed Jul. 2, 2010 and U.S. Provisional Application No. 61/380,174 filed Sep. 3, 2010. U.S. Provisional Application Nos. 61/361,296 and 61/380,174 and U.S. application Ser. Nos. 13/175,770 and 13/175,774 are incorporated herein by reference.

FIELD OF THE INVENTION

This invention relates generally to apparatuses, devices, systems, and methods for monitoring electrical power, and relates more particularly to such apparatuses, devices, systems, and methods that monitor electrical power in one or more main electrical power conductors at an electrical circuit breaker panel of a structure.

DESCRIPTION OF THE BACKGROUND

A structure (e.g., a home or a commercial building) can have one or more main electrical power conductors that supply the electrical power to electrical devices (i.e., the load) in the structure. Most structures use a split-phase electrical power distribution system with up to three main electrical power conductors. The main electrical power conductors enter the structure through an electrical circuit breaker panel. An electrical circuit breaker panel is the main electrical distribution point for electricity in a structure. Electrical circuit breaker panels also provide protection from over-currents that could cause a fire or damage electrical devices in the structure. Electrical circuit breaker panels can be coupled to and overlay at least part of the three main power conductors.

Different manufacturers of electrical circuit breaker panels, including, for example, Square-D, Eaton, Cutler-Hammer, General Electric, Siemens, and Murray, have chosen different conductor spacing and configurations for their electrical circuit breaker panels. Furthermore, each manufacturer produces many different configurations of electrical circuit breaker panels for indoor installation, outdoor installation, and for different total amperage ratings, of which 100 amperes (A) and 200 A services are the most common.

The different conductor layouts in the many different types of electrical circuit breaker panels result in different magnetic field profiles at the metal surfaces of the electrical circuit breaker panels. Moreover, the layout of the internal conductors (e.g., the main electrical power conductors) is not visible without opening the breaker panel and the manner in which the internal conductor layout translates into a magnetic field profile at the surface of the electrical circuit breaker panel requires a detailed knowledge of electromagnetic theory to interpret and model correctly. It is, therefore, difficult to measure accurately the magnetic field of the one or more main electrical power conductors at a surface of the electrical circuit breaker panel. If the magnetic field of the one or more main electrical power conductors at a surface of the electrical circuit breaker panel could be accurately determined, the electrical current and power being used by the load in the structure could be determined.

Accordingly, a need or potential for benefit exists for an apparatus, system, and/or method that allows a non-electrician to determine accurately the magnetic field and other parameters related to the one or more main electrical power conductors at the surface of the electrical circuit breaker panel.

BRIEF DESCRIPTION OF THE DRAWINGS

To facilitate further description of the embodiments, the following drawings are provided in which.

Figure 1:
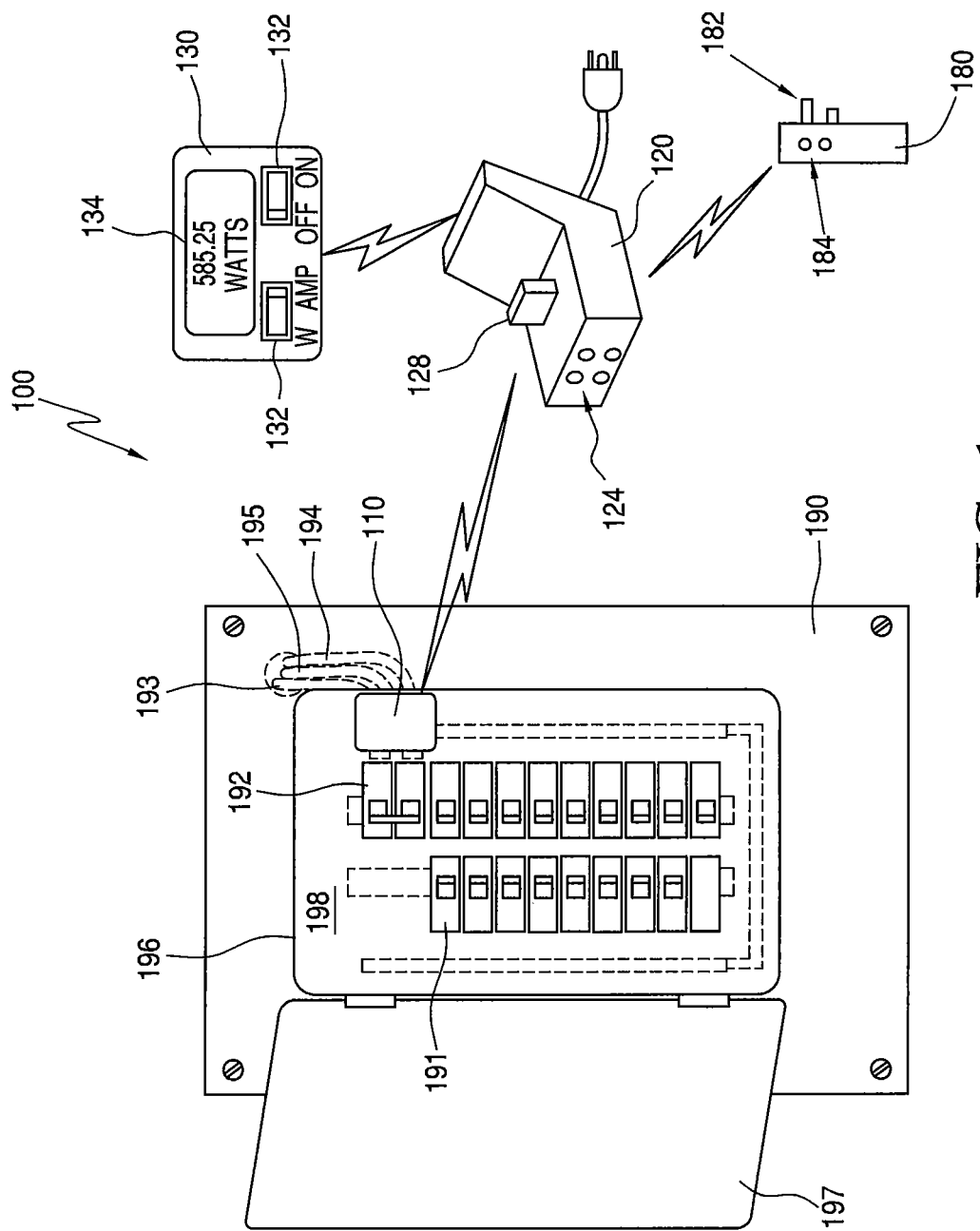
FIG. 1 illustrates a view of an exemplary electrical power monitoring system coupled to a circuit breaker panel, according to a first embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "coupled," and the like does not mean that the coupling, etc. in question is or is not removable.

DETAILED DESCRIPTION OF EXAMPLES OF EMBODIMENTS

Some embodiments concern a method of using a power consumption measurement device. The power consumption measurement device is mechanically coupled to a surface of a circuit breaker box. The circuit breaker box is overlying at least part of one or more main electrical supply conductors for an electrical power infrastructure of a structure. The method can include: determining at least two first current sensor readings from the one or more main electrical supply conductors using at least one sensor in the power consumption measurement device; calibrating the power consumption measurement device using at least in part the at least two first current sensor readings, wherein calibrating the power consumption measurement device can include: applying a Kalman filter using at least the at least two first current sensor readings to determine one or more first calibration coefficients for the power consumption measurement device; after determining the at least two first current sensor readings, electrically coupling a first calibration load to the electrical power infrastructure; while the first calibration load remains electrically coupled to the electrical power infrastructure, determining at least one second current sensor reading from the one or more main electrical supply conductors using the at least one sensor in the power consumption measurement device; re-calibrating the power consumption measurement device using at least in part the at least two first current sensor readings and the at least one second current sensor reading, wherein re-calibrating the power consumption measurement device can include: applying the Kalman filter using at least the at least two first current sensor readings and the at least one second current sensor reading to determine one or more second calibration coefficients for the power consumption measurement device; uncoupling the first calibration load from the electrical power infrastructure; after uncoupling the first calibration load, determining at least one third current sensor reading from the one or more main electrical supply conductors using the at least one sensor in the power consumption measurement device; and determining a first electrical power used by the electrical power infrastructure of the structure using at least the at least one third current sensor reading and the one or more second calibration coefficients.

The same or different embodiments can concern a method of using an electrical sensor device. The electrical sensor device coupled to a first surface of a circuit breaker box. The circuit breaker box overlying an electrical power infrastructure of a building, the electrical sensor device having two or more electrical current sensors. The method can include: determining a first current measurement of a first current in the electrical power infrastructure and a first phase angle measurement of the first current; determining that a first load is coupled to the electrical power infrastructure; while the first load is coupled to the electrical power infrastructure, determining a second current measurement of a second current in the electrical power infrastructure and a second phase angle measurement of the second current; and using a Kalman filter to determine one or more first calibration coefficients for the electrical sensor device at least in part using the first current measurement, the second current measurement, the first phase angle, and the second phase angle. The first phase angle measurement of the first current is relative to a phase of a first voltage drop across the electrical power infrastructure of the building. The second phase angle measurement of the second current is relative to a phase of a second voltage drop across the electrical power infrastructure of the building.

Some embodiments can concern a system for monitoring electrical power usage in an electrical power infrastructure of a building. The building comprising a circuit breaker box and electrical supply conductors of the electrical power infrastructure of the building. The system can include: a power consumption measurement device configured to be coupled to a first surface of the circuit breaker box, the circuit breaker box overlying at least part of the electrical supply conductors for the electrical power infrastructure, the power consumption measurement device comprising one or more electrical current sensors; a first calibration device configured to be electrically coupled to the electrical power infrastructure, the first calibration device comprising one or more first calibration loads; and a calibration module configured to be performed using one or more processors and further configured to at least partially calibrate the power consumption measurement device using a Kalman filter and data obtained from the one or more electrical current sensors of the power consumption measurement device. The power consumption measurement device is configured to obtain at least part of the data while at least one of the one or more first calibration loads is electrically coupled to the electrical power infrastructure and while the power consumption measurement device is coupled to the first surface of the circuit breaker box.

Figure 2:
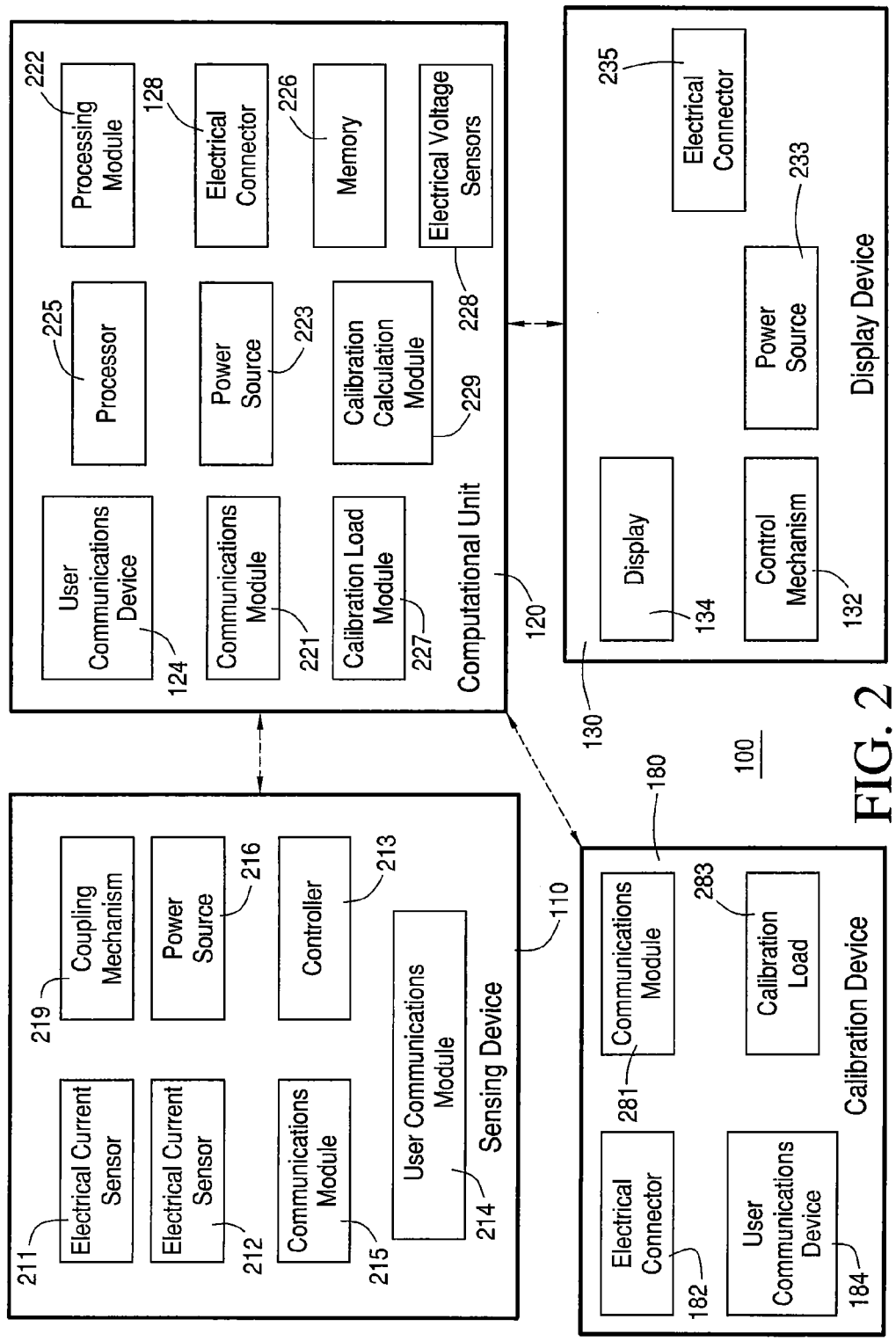
FIG. 2 illustrates a block diagram of electrical power monitoring system, according to the first embodiment.

FIG. 1 illustrates a view of an exemplary electrical power monitoring system 100 coupled to a circuit breaker panel 190, according to a first embodiment. FIG. 2 illustrates a block diagram of electrical power monitoring system 100, according to the first embodiment.

Electrical power monitoring system 100 can also be considered a system for monitoring electrical power usage of a structure (i.e., a building). Electrical power monitoring system 100 can also be considered a devices and system for determining the predicted current used by one or more electrical devices (i.e., the load) in a structure. Electrical power monitoring system 100 is merely exemplary and is not limited to the embodiments presented herein. Electrical power monitoring system 100 can be employed in many different embodiments or examples not specifically depicted or described herein.

In some examples, electrical power monitoring system 100 can include: (a) at least one sensing device 110 (i.e., a power consumption measurement device); (b) at least one computational unit 120; (c) a display device; and (d) at least one calibration device 180.

In some examples, system 100 can be used with breaker panels from different manufacturers and on different types of breaker panels from the same manufacturer. In addition, in some examples, system 100 can be easily installed by an untrained person (i.e., a non-electrician) without opening the breaker panel box and exposing the uninsulated electrical power conductors inside. In some examples sensing device 110 can be located within panel 196 when in operation. In other examples, sensing device 110 can be located outside of panel 196 (e.g., on top of door 197) when in operation.

Also as shown in FIG. 1, a conventional breaker box or circuit breaker panel 190 can include: (a) two or more individual circuit breakers 191; (b) two or main circuit breakers 192; (c) a panel 196 with an exterior surface; and (d) a door 197 that provides access to circuit breakers 191 and 192. At least a portion of main electrical power conductors 193, 194, and 195 can be located within circuit breaker panel 190. "Circuit breaker panel" can also refer to and include fuse boxes, which are still common in buildings with older electrical systems. The electrical power infrastructure of a structure can include at least circuit breaker panel 190 and main electrical power conductors 193, 194, and 195. In some examples, circuit breaker panels can also refer to any type of electrical distribution panel used to provide electricity to a structure.

Main electrical power conductors 193, 194, and 195 are electrically coupled to main circuit breakers 192 and supply the electrical power to electrical devices (i.e., the load) in the structure. Panel 196 overlies at least part of main electrical power conductors 193, 194, and 195 and associated circuitry to protect people from inadvertently contacting these energized electrical power conductors. Usually, panel 196 is composed of steel or another ferrous metal; therefore the magnetic field outside the panel will be non-linearly dependent on the current through power conductors 192, 194, and 195.

Door 197 covers circuit breakers 191 and 192 and is typically closed for aesthetic reasons but can be opened to allow access to the levers of the circuit breakers 191 and 192 within circuit breaker panel 190. In various examples, sensing device 110 can fit within panel 196 so that the door of the breaker panel can be kept closed while sensing device 110 is in operation. In many examples, sensing device 110 has a depth of less than 20 mm. In the same or different examples, sensing device 110 can have a depth of less than 13 mm.

Residential and small commercial electrical service is typically 240 volt split phase service. This refers to the utility providing two 120 V alternating current (AC) source conductors (e.g., power conductors 193 and 194) that are 180 degrees out of phase, along with a neutral conductor (e.g., power conductor 195) that can be used to return current from either power conductor 193 or 194. Power conductors 193, 194, and 195 are the "feeder" or "main" electrical power conductors that carry the incoming power from the utility before being split up into branch circuits that serve different loads. By sensing the magnetic fields generated power conductors 193, 194, and 195, system 100 can sense the total current drawn by all loads from the utility because all loads in the structure are coupled in parallel to power conductors 193, 194, and/or 195.

In the United States, many different types of electrical loads are found in a building served by a 240 V split phase utility service. The electrical loads can be divided into two categories of loads: (a) 120 V loads; and (b) 240 V loads.

The 120 V loads can primarily include lower-wattage loads, i.e., loads plugged into standard 3-prong 120 V 15 A or 120 V 20 A outlets, and small appliances with less than ~2 kW (kilowatt) power draw. These loads are wired in individual circuits between power conductors 193 and 195 pair (the "first phase branch" or the "193-195 leg" of the wiring circuit) or power conductors 194 and 195 pair (the "second phase branch" or the "194-195 leg" of the wiring circuit). When wiring a structure, electricians attempt to balance the anticipated wattage of loads and outlets on each leg, but this is not an exact process so current in the 193-195 leg and the 194-195 leg are likely to be unbalanced because a different total wattage is typically drawn from each pair. When a 120 V load is turned on, its current flows from the utility, through power conductor 193 or 194 through the main and circuit level circuit breakers, to the load, and then back to power conductor 195 and back to the utility.

The 240 V loads are typically large appliances (e.g., electric dryer, stove, air conditioner compressor, electric baseboard heaters) that consume more than two kW (kilowatts). In this case, the load current flows between power conductors 193 and 194 and no load current flows in power conductor 195. Because of the 180 degree phase relationship between the voltages on power conductors 193 and 194, the total voltage is 240 V.

Referring again to FIGS. 1 and 2, computational unit 120 can include: (a) a communications module 221; (b) a processing module 222; (c) a power source 223 with an electrical connector 128; (d) a user communications device 124; (e) a processor 225; (f) memory 226; (g) a calibration load module 227; (h) a calibration calculation module 229; (i) a control mechanism 132; and (j) electrical voltage sensor 228.

Computational unit 120 can be configured to receive the output signal from calibration device 180 and/or sensing device 110 via communications module 221 and process the output signal to determine one or more parameters related to the electrical power usage of the structure (e.g., the electrical power used by the structure and the electrical current in main electrical power conductors 193, 194, and 195). In some embodiments, computational unit 120 can be a personal computer (PC) or other type of computer (e.g., a tablet).

Processor 225 can be a microcontroller such as the MSP430 microcontroller manufactured by Texas Instruments, Inc. In another embodiment, processor 225 is a digital signal processor such as the TMS320VC5505 digital signal processor manufactured by Texas Instruments, Inc. or a Blackfin digital signal processor manufactured by Analog Devices, Inc.

Processing module 222 can be configured to use current measurements from sensing device 110 to determine one or more parameters related to the electrical power usage of the structure (e.g., the electrical current and electrical power of main electrical power conductors 193, 194, and 195).

As will be explained below, calibration calculation module 229 can be configured to use current measurements from sensing device 110 to calibrate electrical power monitoring system 100 (e.g., calculate the calibration coefficients for sensing device 110). Specifically, calibration calculation module 229 can be configured to at least partially calibrate system 100 using a Kalman filter (described below) and data obtained by sensing device 110. That is, calibration calculation module 229 is configured to apply the Kalman filter using the data obtained from electrical current sensors 211 and 212 to determine one or more calibration coefficients.

In some examples, processing module 222 and calibration calculation module 229 can be stored in memory 226 and configured to run on processor 225. When computational unit 120 is running, program instructions (e.g., processing module 222 and/or calibration calculation module 229) stored in memory 226 are executed by processor 225. A portion of the program instructions, stored in memory 226, can be suitable for carrying out method 300 (FIG. 3) as described below.

Calibration load module 227 can include one or more calibration loads. As will be explained below, the one or more calibration loads can be temporarily electrically coupled to, for example, the first phase branch of the electrical power infrastructure of structure to help calibrate electrical power monitoring system 100.

Electrical voltage sensor 228 can be used to determining the amplitude and phase angle of the voltage across the electrical power infrastructure. The phase angle of the current across is equal to the phase angle measured by electrical current sensors 211 minus the phase angle of the voltage measured using electrical voltage sensor 228. That is, the phase angle of the current can be calculated in reference to the zero point crossing of the voltage.

In some examples, sensing device 110 can communicate the current measurement made by electrical current sensors 211 to computational unit 120 so the phase angle of the current can be calculated. In other examples, computational unit 120 can communicate the voltage measurement by electrical voltage sensor 228 to sensing device 110 so the phase angle of the current can be calculated. In other examples, electrical voltage sensor 228 can be located in calibration device 180.

User communications device 124 can include can include one or more buttons configured to at least partially control computational unit 120. Power source 223 can provide electrical power to communications module 221, a processing module 222, user communications device 124, processor 225, memory 226, and/or electrical voltage sensors 228.

In some examples, power source 223 can be coupled to electrical connector 128 that can be coupled to an electrical wall outlet of the electrical power infrastructure.

In some examples, display device 130 can include: (a) a display 134; (b) a control mechanism 132; (c) an electrical connector 235 configured to coupled to electrical connector 128; and (d) a power source 233. In some examples, display device 134 can be detachable from computational unit 120 and wirelessly communicate with computational unit 120. In other examples display device 120 can be part of computational unit 120.

Power source 223 can provide electrical power to display 134, and control mechanism 132. Display 134 can be configured to display information to a user. In one example, user communications device 134 can be a monitor, a touch screen, and/or one or more LEDs (light emitting diodes).

Control mechanism 132 can include one or more buttons configured to at least partially control computational unit 120 or at least display 134. In one example, control mechanism 132 can include a power switch (i.e., an on/off switch) and/or a display switch configured to control what is displayed on display 134.

Still referring to FIGS. 1 and 2, sensing device 110 can include: (a) two or more or magnetic field sensors or electrical current sensors 211 and 212; (b) a controller 213; (c) a user communications module 214; (d) a communications module 215; (e) a power source 216; and (f) a coupling mechanism 219. Controller 213 can be used to control electrical current sensors 211, user communications module 214, communications module 215, and power source 216.

In some examples, electrical current sensors 211 and 212 can include an inductive pickup, a Hall effect sensor, a magnetoresistive sensor, or any other type of sensor configured to respond to the time varying magnetic field produced by the conductors inside circuit breaker panel 190.

In various examples, sensing device 110 can be configured to be coupled to a surface of panel 196 using coupling mechanism 219. In some examples, coupling mechanism 219 can include an adhesive, a Velcro® material, a magnet, or another attachment mechanism.

Communications module 215 can be electrically coupled to electrical current sensors 211 and controller 213. In some examples, communications module 215 communicates the voltages or other parameters measured using electrical current sensors 211 to communications module 221 of computational unit 120. In many examples, communications module 215 and communications module 221 can be wireless transceivers. In some examples, electrical signals can be transmitted using Wi-Fi (wireless fidelity), the IEEE (Institute of Electrical and Electronics Engineers) 802.11 wireless protocol or the Bluetooth 4.0+HS (High Speed) wireless protocol. In further examples, these signals can be transmitted via a Zigbee (IEEE 802.15.4 wireless protocol), Z-Wave, or a proprietary wireless standard. In other examples, communications module 215 and communications module 221 can communicate electrical signals using a cellular or wired connection.

User communications module 214 can be configured to display information to a user. In one example, user communications module 214 can be a LCD (liquid crystal display), and/or one or more LEDs (light emitting diodes).

Controller 213 can be configured to control electrical current sensors 211, communications module 215, user communications module 214, and/or power source 216.

Calibration device 180 can include: (a) a communications module 281; (b) an electrical connector 182; (c) a calibration load 283; and (d) a user communication device 184. In some examples, communications module 281 can be similar or the same as communications module 215 and/or 221. Electrical connector 182 can be an electrical power plug in some examples. User communication device 184 can be configured to display information to a user. In one example, user communication device 184 can be one or more LEDs.

Figure 3:
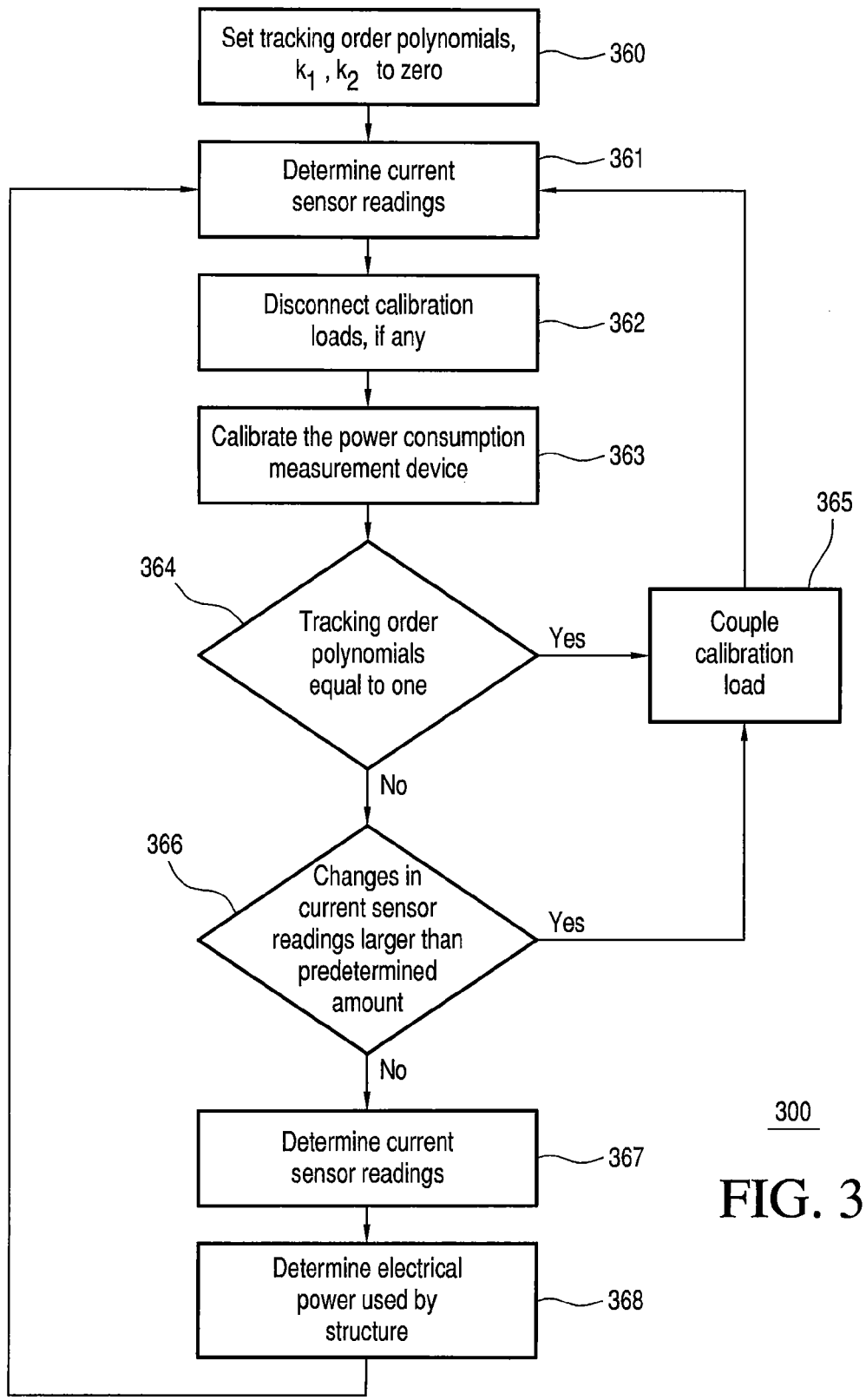
FIG. 3 illustrates an exemplary example of a flow chart for an embodiment of a method of determining the predicted current in the electrical power conductors.

FIG. 3 illustrates a flow chart for an embodiment of a method 300 of determining the predicted current in the electrical power conductors. Method 300 is merely exemplary and is not limited to the embodiments presented herein. Method 300 can be employed in many different embodiments or examples not specifically depicted or described herein. In some embodiments, the activities, the procedures, and/or the processes of method 300 can be performed in the order presented. In other embodiments, the activities, the procedures, and/or the processes of the method 300 can be performed in any other suitable order. In still other embodiments, one or more of the activities, the procedures, and/or the processes in method 300 can be combined or skipped.

Method 300 describes a general method of determining the predicted electrical power (and/or electrical current) used in the electrical power conductors of a structure. The method described below can be used to accurately calculate the predicted currents regardless of the position of the sensing device 110 (FIG. 1) on panel 196 (FIG. 1) with the exception of the following points: (a) if electrical current sensors 211 and 212 (FIG. 2) are placed so far away from the main power conductors 193 and 194 (FIG. 1) that almost no discernable signal is measured; and (b) if all of the electrical current sensors 211 and 212 (FIG. 2) are placed very close to neutral electrical power conductors 195 (FIG. 1) and far away from electrical power conductors 193 and 194.

Method 300 (or portions thereof) can also be considered a method of calibrating an electrical monitoring system, according to an embodiment. Method 300 (or portions thereof) can be considered to describe a general method of calibrating a sensing device. This method can involve using a Kalman filter to determine one or more calibration coefficients that can be used to calculate the predicted current in the electrical power infrastructure of the structure.

Referring to FIG. 3, method 300 describes an exemplary method to calibrate the current sensors and determine the electrical current and power in an electrical system of a structure using a Kalman filter.

The Kalman filter, also known as linear quadratic estimation (LQE), is an algorithm which uses a series of measurements observed over time, containing noise (random variations) and other inaccuracies, and produces estimates of unknown variables that tend to be more precise than those that would be based on a single measurement alone. More formally, the Kalman filter operates recursively on streams of noisy input data to produce a statistically optimal estimate of the underlying system state. Specifically, $$\hat{\chi}_{K/K-1} = A_K \hat{\chi}_{K-1/K-1} + B_K \hat{u}_K \quad (1)$$

where $\hat{\chi}_{K/K-1}$ represents that estimate of x at a time k given observations up to, and including time k-1, $A_K$ is the predict matrix or state transition model that governs the dynamics of the system. $B_k$ is a control matrix with a control vector $\hat{u}_K$.

The covariance estimate, $P_{k/k-1}$, for the state vector is:

$$P_{K/K-1} = A_K P_{K-1/K-1} A_K^T + Q_K. \quad (2)$$

Where $Q_k$ is the process noise covariance matrix, from which a process noise is modeled to be added to. With the updated state vector and covariance matrix, Kalman Update steps can be calculated. First, the measurement residual, $\hat{y}_K$, is calculated:

$$\hat{y}_K = \hat{z}_K - H_K \hat{\chi}_{K/K-1}, \quad (3)$$

where $\hat{z}_K$ is the measurement vector and $H_k$ is the observation model. Next, the residual covariance, $S_k$, is calculated:

$$S_K = H_K P_{K/K-1} H_K^T + R_K. \quad (4)$$

here $R_K$ is observation noise covariance. Finally, the Kalman gain matrix, $K_K$, is calculated to update the state vector and covariance matrix:

$$K_K = P_{K/K_1} H_K^T S_K^{-1} \quad (5)$$

$$\hat{\chi}_{K/K} = \hat{\chi}_{K/K-1} + K_K \hat{y}_K \quad (6)$$

$$P_{K/K} = (I - K_K H_K) P_{K/K-1} \quad (7)$$

Receiving the amplitude and phase signal from a number of non-contact current sensors, a non-linear model of the system (state vector) can be created:

$$V_{z,21} \angle \phi \angle = (A_{v,1} I_1 (1 + A \angle_{11} I_1 + \ldots) +$$
$$A \angle_{10}) \angle \phi_1 + (B \angle_1 I_2 (1 + B \angle_{11} I_2 + \ldots) +$$
$$B \angle_{10}) \angle \phi_2 + (C \angle_1 Z (1 + C \angle_{11} Z_1 + \ldots) +$$
$$C \angle_{10}) \angle \phi_3 \quad (8)$$

For $\angle = 1, 2$ (2 sensors), and $Z = I_1 \angle \phi_1 + I_2 \angle_2$. These equations can be first, second, third or higher order polynomials, or in principle can be generalized to arbitrary functions (including hyperbolic functions, are used to express relationships in magnetostatics).

For this system, the state vector, X, is estimated to be:

$$\hat{\chi} = [L_1 \angle, L_2 \angle, A \angle_{10}, A \angle_1, A \angle_{11}, \ldots, B \angle_{10}, B \angle_1, B \angle_{11}, \ldots] \quad (9)$$

The observation vector, z, is:

$$\hat{z} = [V_0 \angle \phi_0, \ldots, V_1 \angle \phi_1, \ldots, V_{N-1} \angle \phi_{N-1}] \quad (10)$$

for all the sensors $\angle = (0, \ldots, N-1)$.

To relate the observation vector to the state vector, equation (8) is used. To make the observation model, $H_K$, a Jacobian matrix from equation (8) can be constructed. This makes the update step an Extended Kalman Filter, while the predict step is a normal linear one.

The observation covariance, $R_K$, can be estimated a priori based on the noise of the sensors and system.

Figure 4:
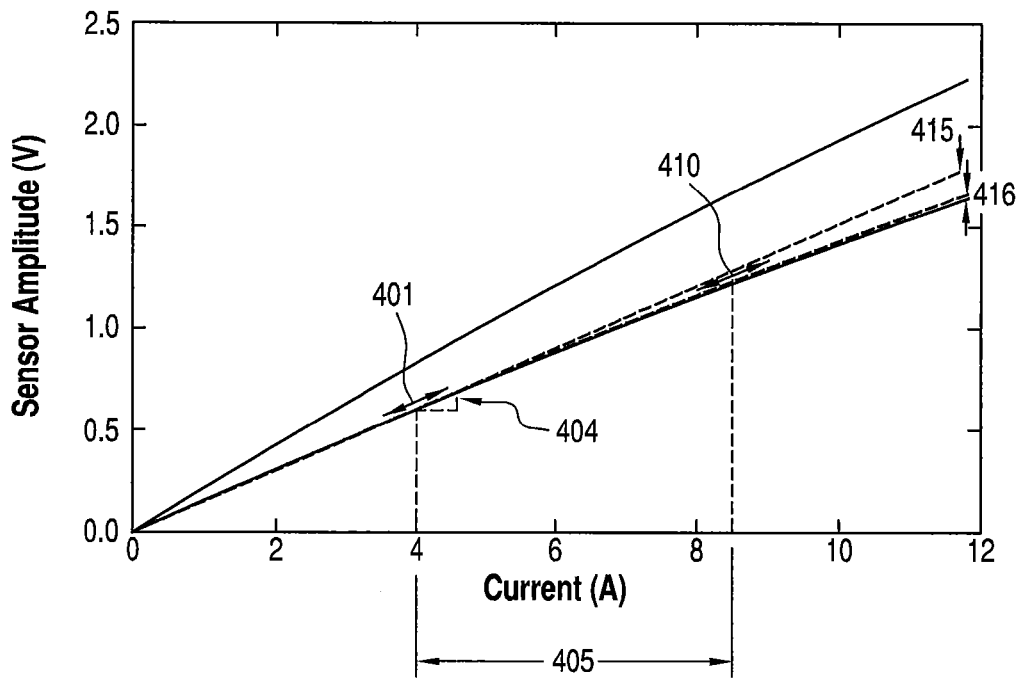
FIG. 4 illustrates an exemplary example of two curves corresponding to the amplitude of two sensors attached to the outer metal plate of an in-home circuit box panel while varying the current through one of the three main power conductors.

Now turning to an application of the Kalman Filter, FIG. 4 illustrates an exemplary example of two curves corresponding to the amplitude of two sensors attached to the outer metal plate of an in-home circuit box panel (e.g., panel 190). As the current is varied on one leg of the electrical power infrastructure from zero Amps to twelve Amps, the corresponding curves are created. Note the curves shown are the case when $I_2 = 0$, where $I_2$ is the current in the second one of conductors 193 and 194.

Figure 5:
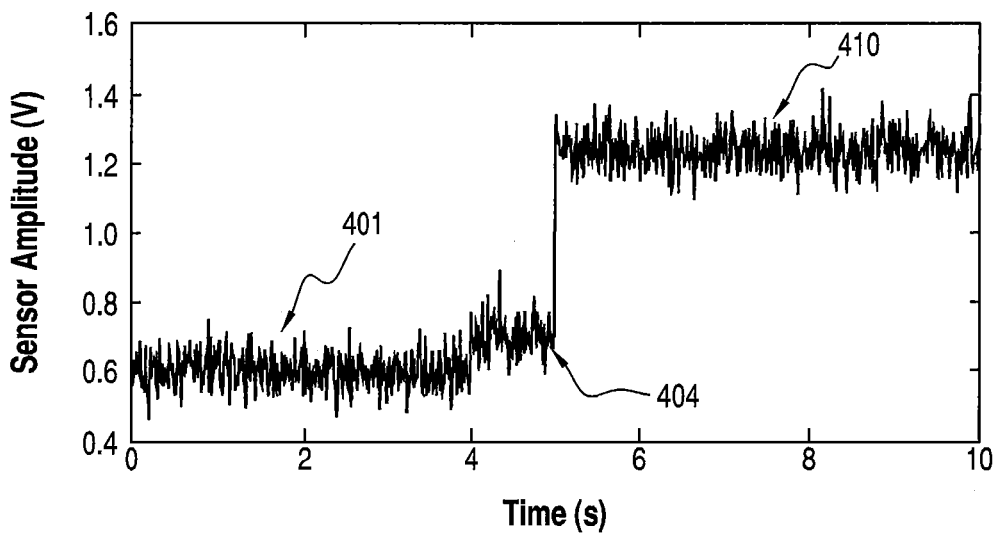
FIG. 5 illustrates an exemplary example of sample current waveform over time that corresponds to operating points on curve shown in FIG. 4.

FIG. 5 illustrates an exemplary example of sample current waveform over time that corresponds to operating points on curve FIG. 4. In some examples, since the calibration procedure is performed at run-time, when system 100 (FIG. 1) cannot control when a user utilizes appliances in the home, any estimation can only be done differentially. For the sake of clarity, system 100 (FIG. 2) is assumed to have a linear model based on the data obtained. In FIG. 5, the first four seconds of operation show a sensor reading on electrical current sensor 211; this corresponds to an input current on conductor 193 of 4 A, created by an appliance in the structure. During this period of time, the change in the current sensor value can be used to continue to estimate the first order curve fit. At the end of period 401 in FIGS. 4 and 5, a linear fit to the data obtained so far has an error relative to the true nonlinear curve 415. In order to correct this error, other parts of the curve must be sampled. After four seconds in the example shown in FIG. 5, an appliance in the environment increases the current by 0.5 A. System 100 (FIG. 1) measures a change in the signal to determine if the change exceeds a predetermined threshold. Once this predetermined threshold is crossed, a fixed current is applied by system 100 (FIG. 1) to move the system to point 5A higher and proceeds along path 410. In some examples, calibration load 283 (FIG. 2) is coupled to the electrical power infrastructure. Given the prediction of what the sensor value should be relative to the known change in load current, a new 2nd order estimate can be created using the Kalman filter. This second order estimate that includes time series data 401, 404, and 410. Based on these additional data points, a new estimated error 416 is substantially less than error 415. As time passes, and more points other than 401 and 410 are sampled, the estimate of the non-linearity in the system 100 will improve, and the estimate of the current in the two legs (e.g., conductors 193 and 194 of FIG. 1) will also improve.

Figure 6:
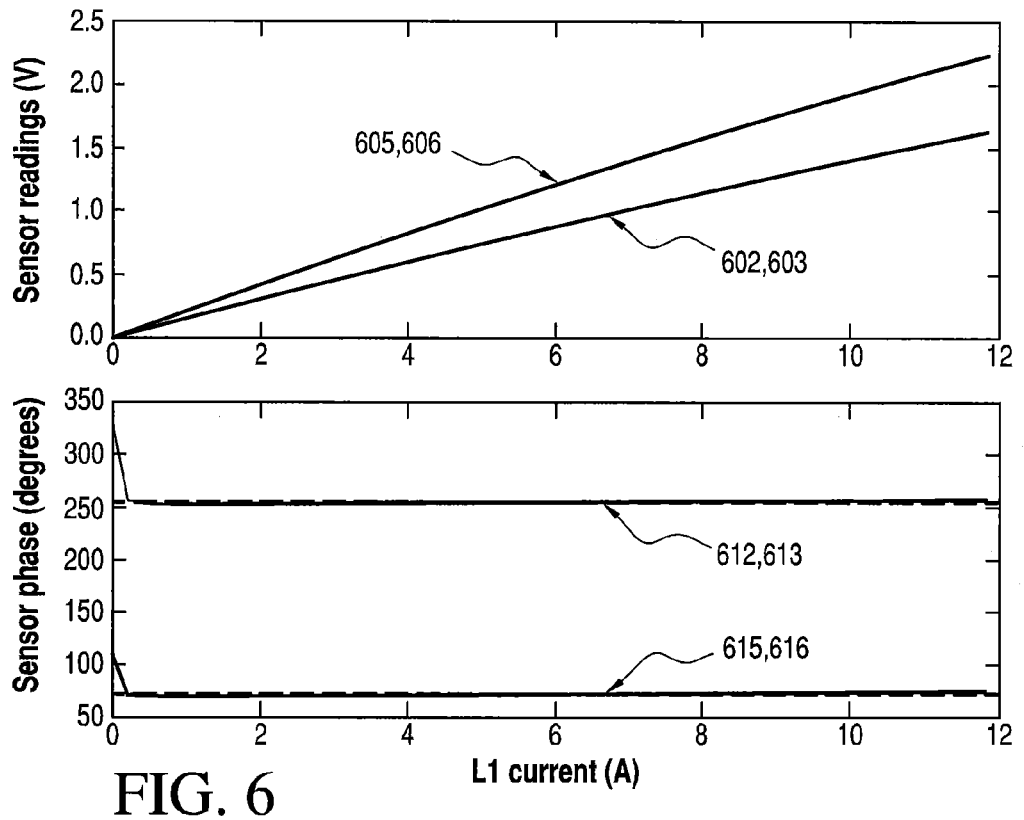
FIG. 6 illustrates shows the amplitude and phase, respectively of a two sensor system as actual data and estimated non-linear parameters over a range of currents for a 2nd order polynomial model.
Figure 7:
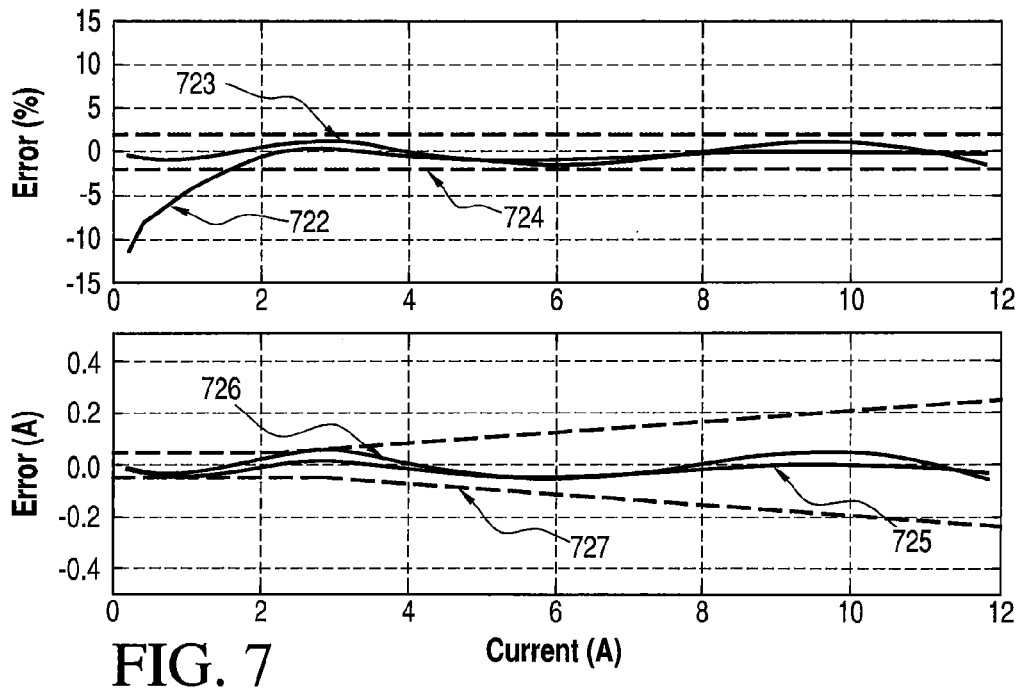
FIG. 7 shows the error in the current estimate for the 2nd order model of FIG. 6 on the current through conductors.

FIG. 6 illustrates shows the amplitude (top) and phase (bottom), respectively of a two sensor system as actual data 602, 605, 612, and 615 (solid lines) and estimated non-linear parameters over a range of L1 current 603, 606, 613, and 616 (dashed lines) for a 2nd order polynomial model. For the sake of clarity, the conductor 194 current is set to 0. FIG. 7 shows the error in the current estimate for the 2nd order model on the current through conductors 193 and 195 both as a percentage error 723, 722 and absolute error 725, 726 in Amps. The error bars are set to a 2% error 724 with a lower bound 727 of 50 mA.

Figure 8:
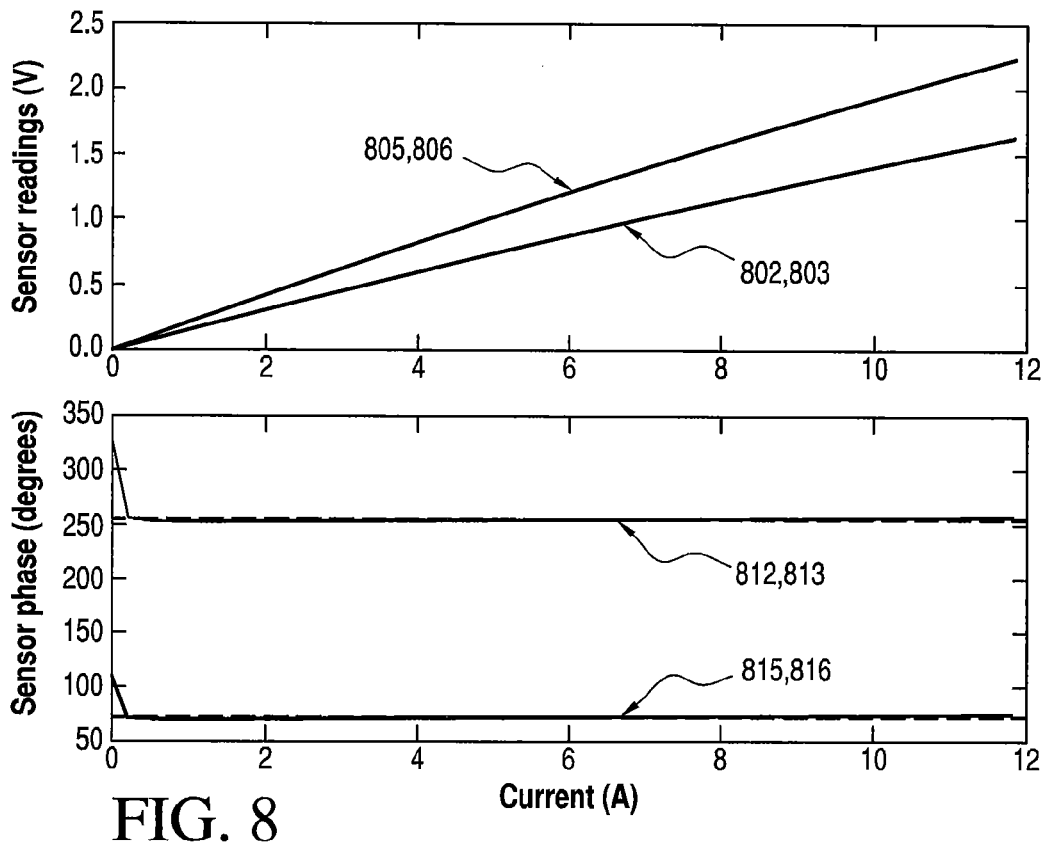
FIG. 8 illustrates the amplitude and phase of a two sensor system as actual data and estimated non-linear parameters over a range of currents for a 3rd order polynomial model.
Figure 9:
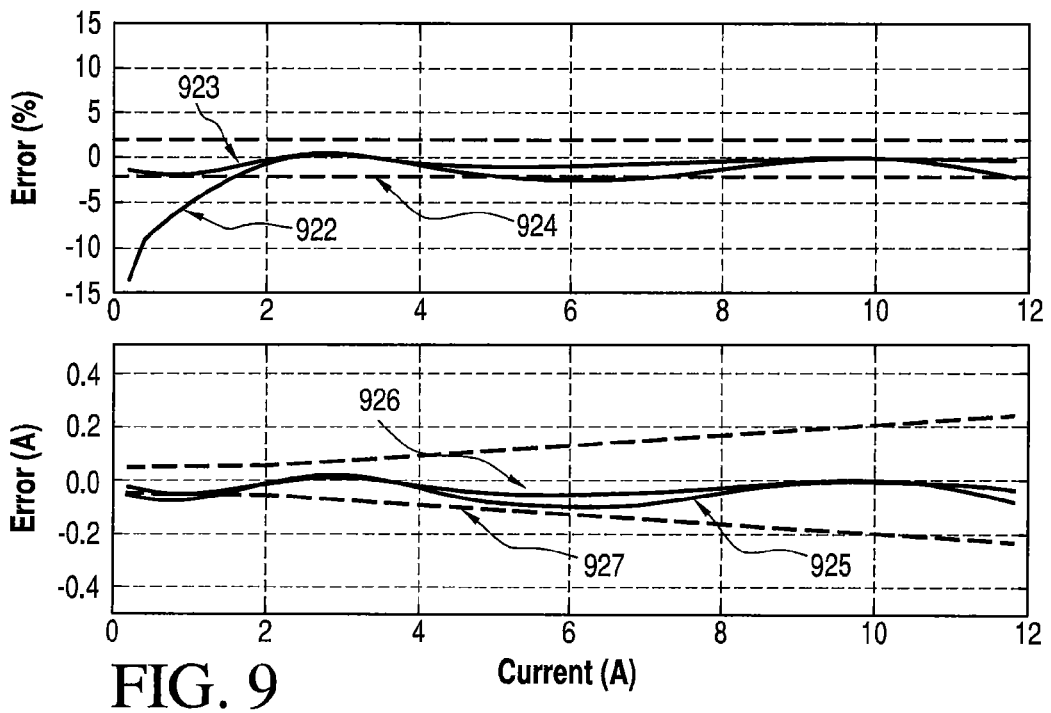
FIG. 9 illustrates the error in the current estimate for the 3rd order model on the current through conductors.

FIG. 8 illustrates the amplitude (top) and phase (bottom) of a two sensor system as actual data 802, 805, 812, and 815 (solid lines) and estimated non-linear parameters over a range of L1 current 803, 806, 813, and 816 (dashed lines) for a 3rd order polynomial model. For the sake of clarity, conductor 194 current is set to 0. FIG. 9 illustrates the error in the current estimate for the 3rd order model on the current through conductors 193 and 195 both as a percentage error 923 and 922, and absolute error 925 and 926 in Amps. The error bars 924 are set to a 2% error with a lower bound 927 of 50 mA. Note that the error for the 2nd and 3rd order polynomials are very similar, suggesting a 2nd order model is sufficient in some embodiments.

Referring back to FIG. 3, method 300 in FIG. 3 includes an activity 360 of setting one or more order tracking polynomials (e.g., $k_1$ and $k_2$) to zero. These order tracking polynomials are used in method 300 track the order (first-order, second-order, third-order, etc) of the error of the Kalman filter. In some examples, there is a tracking polynomial for each sensor in the sensing device. For method 300 as described herein, it will be assumed that there are two current sensors in the sensing device. This method can be generalized to a sensing device with any number of current sensors. In this example, the filter order for sensor (e.g., sensors 211 and 212 (FIG. 2)) are set to zero using calibration load module 227 (FIG. 2). Furthermore, the estimation state vector to the filter order of $k_1$ and $k_2$ for sensors 1 and 2, respectively are configured. In some examples, the filter order is 0, or simply a constant value for the sensors.

Method 300 next includes an activity 361 of determining at least two first current sensor readings from electrical supply conductors using the current sensors in the power consumption measurement device. In some examples, activity 361 can be considered obtaining and storing one or more first measurements of current.

In some examples, sensing device 110 (FIGS. 1 & 2) can be used to obtain measurements using electrical current sensors 211 and 212 (FIG. 2). These measurements can include the nominal current flowing in at least one of power conductor 193 or 194 (FIG. 1) due to electrical devices that are drawings electrical power. Additionally, at the sensors (e.g., sensors 211 and 212 (FIG. 2)), an amplitude and phase measurement can be made. In some examples, the measurements are made on both the first phase branch and a second phase branch of the electrical power infrastructure.

Method 300 of FIG. 3 continues with an activity 362 of uncoupling any calibration loads coupled to the electrical power infrastructure if a calibration loads is coupled to the electrical power infrastructure. In some examples, the load of calibration device 180 (FIGS. 1 & 2) can be uncoupled from the electrical power infrastructure.

Next, method 300 of FIG. 3 including an activity 363 of calibrating the power consumption measurement device. In some examples, activity 363 uses the current sensor readings from activity 361 to calibrate the power consumption measurement device. As part of activity 363, the filter order for sensor (e.g., sensors 211 and 212 (FIG. 2) can be incremented using calibration load module 227 (FIG. 2).

In many examples, activity 361 can also include applying a Kalman filter using at least the current sensor readings to determine calibration coefficients for the power consumption measurement device. In some examples, calibration load module 227 (FIG. 2) can run on processor 225 (FIG. 2) to calculate the calibration coefficients. That is, calibration load module 227 (FIG. 2) can run a Kalman filter to update the estimate of the calibration polynomial(s). The Kalman filter can estimate the mean of the sensor value(s) as the house power consumption changes as a function of usage. In many examples, the Kalman filter can be calculated as described above.

Method 300 of FIG. 3 continues with an activity 364 of determining if the one or more order tracking polynomials (e.g., $k_1$ and $k_2$) are one. If the one or more order taking polynomials are one, the next activity is an activity 365. If the one or more order taking polynomials are not one, the next activity is an activity 366

Activity 365 of method 300 (FIG. 3) include an activity of electrically coupling one or more calibration loads to the electrical power infrastructure. In some examples, calibration load 283 in calibration device 180 (FIG. 2) is coupled to the electrical power infrastructure. After activity 365, the next activity is activity 361 of determining the current sensor readings.

Activity 366 of method 300 of FIG. 3 includes determining if the sensors current readings measured in activity 361 changed by more than a predetermined amount. In one example, the predetermined amount can be 0.5%, 1.0%, 10%, 25%, or 100% of the previous current reading. In other examples, the predetermine amount can be actual current amount (e.g., 0.1 A, 0.5 A, 1 A, or 5 A) If the sensor current reading changed by more than the predetermined amount, then the next activity is activity 366. If the sensor current reading did not change by the predetermined amount, the next activity is an activity 367.

In other examples, activity 366 can be skipped if enough calibration reading have been taken in a predetermined period (e.g., a minute, an hour, a day, and a month). Note the threshold can be a dynamic quantity; it is important that the zones where the current is increased with the fixed load are such that they are substantially overlapping, or cover a suitable range of how much the current through each leg could change. Otherwise, the estimator will likely over fit the data, decreasing the accuracy of the estimate.

Activity 367 of determining at least two first current sensor readings from electrical supply conductors using the current sensors in the power consumption measurement device. In some examples, activity 367 can be similar or the same as activity 361 of FIG. 3.

After activity 366, method 300 includes an activity 368 of determining the electrical power usage by the electrical power infrastructure. In some examples, activity 368 can calculate updated calibration coefficients using the Kalman filter and then use the calibration coefficients, the current measurements, the phase angle measurements, and/or voltage measurements to calculate the electrical power and other items related to the electrical energy usage by the structure. After activity 368, the next activity in method 300 is activity 361.

Method 300 establishes simple criteria for enabling the calibration loads to properly calibrate the current sensor. Embodiments of method 300 can allow for more and/or different criteria to be utilized for turning the calibration loads on and for determination of the polynomial order. For example, rather than a threshold in the change of current sensor described in activity 366, the range of anticipated total current coverage, the number of points acquired, random application of the load, or any a priori information concerning the shapes of the curves may be utilized to improve the estimation algorithm and it's convergence properties. Also, the non-linear function may not be a polynomial, but may be a hyperbolic or other type of function.

Although method 300 of FIG. 3 as described uses a Kalman filter, it should be noted that other embodiments of this invention can utilize other filters such as: an Unscented Kalman Filter (UHF); a particle filter; a custom-designed derived Maximum Likelihood or recursive Bayesian estimation algorithm.

Other embodiments of activity 365 of FIG. 3 can include using information from other non-controllable loads in the home instead of or in addition to the calibrations loads 283 (FIG. 2). These additional loads could be used to improve the calibration of system 100 (FIGS. 1 and 2). This method could be used if the controllable loads are small due to cost or size reasons. While it would typically be difficult to identify a specific product within a family of products, if nevertheless one has been identified, recognizing the device turning on and off with known power consumption could be used to perform further calibration of the current sensors. If a large current consumption appliance is recognized, for example a refrigerator or oven, this large current consumption appliance could provide a substantially larger range than the calibration loads, and therefore providing faster convergence or higher accuracy.

Furthermore, the number of coefficients to estimate will affect the minimum number of measurements or sensors required. If the polynomial is of order P, and the 0th order component is non-zero, the number of coefficients to estimate for N sensors will be a total of:

$$3NP+3N+5 \tag{11}$$

If the 0th order component is zero, this will be 3NP+5. For M measurements, 2NM numbers will be obtained. Assuming the sensors are not linearly dependent, the minimum number of points required to solve for the unknowns will be:

$$2NM \geq 3NP+3N+5 \tag{12}$$

$$2NM \geq 3NP+5 \tag{13}$$

For the non-zero 0th order and the zero 0th order respectively. As an example, for a 1st order system (P=1) with a zero 0th order component, 2 sensors (N=2), M≥3; for a 2nd order system (P=2), M≥5; for a 3rd order system (P=3), M≥6.

As the polynomial order may increase with increasing number of samples, the order of the state vector or the process covariance, $Q_K$, can be dynamically adjusted to account for changes in the number of samples or confidence in the estimate of the currents from the sensor readings.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the method described above in relation to FIG. 3 may be comprised of many different activities, procedures and be performed by many different modules, in many different orders, that any element of figure one may be modified, and that the foregoing discussion of certain of these embodiments does not necessarily represent a complete description of all possible embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method comprising:
using an electrical sensor device, determining a first current measurement of a first current in an electrical power infrastructure of a building and a first phase angle measurement of the first current, wherein the electrical sensor device is coupled to a first surface of a circuit breaker box, the circuit breaker box is overlying the electrical power infrastructure of the building, and the electrical sensor device comprises two or more electrical current sensors;
determining that a first load is coupled to the electrical power infrastructure;
while the first load is coupled to the electrical power infrastructure, determining a second current measurement of a second current in the electrical power infrastructure and a second phase angle measurement of the second current; and
using a Kalman filter to determine one or more first calibration coefficients for the electrical sensor device at least in part using the first current measurement, the second current measurement, the first phase angle measurement, and the second phase angle measurement;
wherein:
the first phase angle measurement of the first current is relative to a phase of a first voltage drop across the electrical power infrastructure of the building; and
the second phase angle measurement of the second current is relative to a phase of a second voltage drop across the electrical power infrastructure of the building.

2. The method of claim 1, further comprising:
determining the first voltage drop across the electrical power infrastructure of the building.

3. The method of claim 1, further comprising:
while the first load is coupled to the electrical power infrastructure, determining the second voltage drop across the electrical power infrastructure of the building.

4. The method of claim 1, further comprising:
determining that the first load is uncoupled from the electrical power infrastructure.

5. The method of claim 1, wherein:
using the Kalman filter comprises:
using one or more computer processors to apply the Kalman filter.

6. The method of claim 4, further comprising:
after determining that the first load is uncoupled from the electrical power infrastructure, determining a third current measurement of a third current in the electrical power infrastructure and a third phase angle measurement of the third current; and
determining a first electrical power used by the electrical power infrastructure of the building using the third current measurement of the third current in the electrical power infrastructure and the third phase angle measurement of the third current and the one or more first calibration coefficients, wherein:

the third phase angle measurement of the third current is relative to the phase of a third voltage drop across the electrical power infrastructure of the building.

7. The method of claim 6, further comprising:

determining the third voltage drop across the electrical power infrastructure of the building.

* * * * *